United States Patent [19]

Shen

[11] Patent Number: 5,036,426
[45] Date of Patent: Jul. 30, 1991

[54] METHOD AND APPARATUS FOR TUNING AND MATCHING AN NMR COIL

[75] Inventor: Gary G. Shen, Arlington, Tex.

[73] Assignee: Board of Regents, The University of Texas System, Austin, Tex.

[21] Appl. No.: 483,577

[22] Filed: Feb. 22, 1990

[51] Int. Cl.$^5$ .................... H01G 4/38; G01R 33/20
[52] U.S. Cl. .................................. 361/329; 324/318
[58] Field of Search .............. 361/277, 299, 328, 329, 361/330; 334/78–83; 324/311, 318, 319, 322

[56] References Cited

U.S. PATENT DOCUMENTS

| 4,644,798 | 2/1987 | Tamura et al. | 73/708 |
| 4,710,719 | 12/1987 | Doty | 324/318 |
| 4,737,744 | 4/1988 | Hayward et al. | 333/168 |
| 4,742,304 | 5/1988 | Schnall et al. | 324/318 |
| 4,763,074 | 8/1988 | Fox | 324/314 |
| 4,820,985 | 4/1989 | Eash | 324/318 |
| 4,833,412 | 5/1989 | Zens | 324/322 |
| 4,837,516 | 6/1989 | Takabashi | 324/322 |
| 4,859,950 | 8/1989 | Keren | 324/322 |
| 4,926,147 | 5/1990 | Oppelt | 334/81 |

OTHER PUBLICATIONS

Article entitled "Radio Frequency Coils (Resonators)" by C. E. Hays, General Electric Medical Systems Group, Milwaukee, Wisc.; W. A. Edelstein and J. F. Schenck, GE Corporate Research and Development Center, Schenectady, N.Y.

Primary Examiner—Donald A. Griffin
Attorney, Agent, or Firm—Baker & Botts

[57] ABSTRACT

Apparatus for tuning an NMR probe coil (10) to a desired frequency ($\omega$) and matching the coil (10) and the apparatus to a desired input impedance (20) comprises a differential capacitor (54, 70, 80, 120) having first, second and third terminals. The capacitance across the first and third terminals of the differential capacitor (54, 80, 120) is constant and is preselected to obtain the desired resonant frequency ($\omega$). The capacitance across first and second terminals of the capacitor (54, 70, 80, 120) is variable and is adjusted to obtain the desired input impedance ($Z_0$) without affecting the capacitance across the first and third terminals thereof.

25 Claims, 3 Drawing Sheets $$Z_0 = \frac{r_1(C_1+C_2-\omega^2 LC_1C_2)+(\omega LC_1-\frac{1}{\omega})(\omega C_1C_2r)}{(C_1+C_2-\omega^2 LC_1C_2)^2+(\omega C_1C_2r)^2}$$

$$\omega = \left\{ \frac{1}{2L^2C_1^2C_2} \left[ \left[ -(r^2C_1^2C_2-LC_1C_2-LC_1(C_1+C_2)) \right] \pm \sqrt{(r^2C_1^2C_2-LC_1C_2-LC_1(C_1+C_2))^2 - 4(L^2C_1^2C_2)(C_1+C_2)} \right] \right\}^{\frac{1}{2}}$$

FIG. 1b $$Z_0 = \frac{(1-\omega^2 L(C_1+C_2))\omega rC_1-\omega r(C_1+C_2)(1-\omega^2 LC_1)}{\omega C_2(\omega^2 r^2 C_1^2+(1-\omega^2 LC_1)^2)}$$

$$\omega = \left\{ \frac{(r^2C_1(C_1+C_2)-L(C_1+C_2))+\sqrt{(r^2C_1(C_1+C_2)-LC_1)^2+4L^2C_1(C_1+C_2)}}{2L^2C_1(C_1+C_2)} \right\}^{\frac{1}{2}}$$

FIG. 2b

METHOD AND APPARATUS FOR TUNING AND MATCHING AN NMR COIL

TECHNICAL FIELD OF THE INVENTION

The present invention relates in general to nuclear magnetic resonance tuning and matching methods and apparatus, and more particularly to methods and apparatus of tuning and matching an NMR coil using a differential capacitor.

BACKGROUND OF THE INVENTION

In nuclear magnetic resonance (NMR) machines, a high-intensity magnetic field is generated by an extremely strong magnet, which usually is superconducting.

One conventional NMR main magnet design is toroidally shaped. An extremely strong, extremely uniform magnetic field is generated within a predetermined volume within an axial bore of this magnet. Inserted into the axial bore are the sample, tissue or body to be analyzed, and a combination radio frequency transmitting and sensor coil. The RF probe coil is situated to generate an oscillating field at right angles to the main field. The oscillating RF field causes an oscillation in the alignment of the chemical species. The oscillation of the chemical species within the magnet causes the emission of radio frequency signals, which are sensed by the RF probe coil.

In order to generate the appropriate frequency for oscillation, it is necessary to tune the inductive and capacitive elements of the sensor or probe coil such that there is optimum resonance in the circuit corresponding to the desired frequency. This tuning will vary according to the type of coil used and with the environment in which it is put. In general, tuning of the coil must occur with each new sample or body to be analyzed.

It is also necessary to match the impedance of the inputs of the probe coil to an RF-energy generating source in order to obtain the maximum transmission of RF-energy into the coil and to optimize the signal to noise ratio. Because the criteria for tuning and matching are different, the tuning and matching process is iterative, time consuming and difficult, as will be shown in more depth in the detailed description below.

In view of the foregoing, a need has arisen for methods and apparatus for tuning and matching an NMR probe coil wherein the resonant frequency and impedance matching conditions are decoupled from each other.

SUMMARY OF THE INVENTION

One aspect of the present invention comprises a differential capacitor having first, second and third terminals. The capacitance across the first and second terminals may be adjusted while the capacitance across the first and third terminals remains substantially constant and independent of the value of the capacitance across the first and second terminals.

In one embodiment, the first and third terminals are connected to fixed parallel plates that are insulated from each other. A conductive tap plate is disposed in parallel between the first and third terminals, and is connected to the second terminal. The tap plate is movable toward the first plate or away from it in order to vary the capacitance across the first and second terminals, all the while keeping the capacitance between the first and third terminals constant.

In another embodiment of the invention, a plurality of fixed first plates are connected to the first terminal, while a like plurality of second plates are fixed at a predetermined distance from the first plates and are connected in parallel to the third terminal. A like plurality of tap plates are insulatively disposed between respective pairs of first and second plates, and are operable to move in unison toward or away from respective ones of the first plates in order to vary the capacitance across the first and second terminals. Once again, the capacitance across the first and third terminals remains the same.

In another aspect of the invention, the differential capacitor is used in a circuit for tuning to the desired resonant frequency of an NMR probe coil, while at the same time matching the output impedance of an EMF source. The first and third terminals of the above-described differential capacitor are coupled across terminals of the probe coil. The differential capacitor is preselected such that the capacitance across the first and third terminals of it, when placed across the terminals of the probe coil, will result in the desired resonant frequency. The second terminal is connected to a terminal of the EMF source, while the other terminal of the EMF source is connected to one terminal of the probe coil. The capacitance across the first and second terminals of the differential capacitor is adjusted until the EMF source is matched.

In a particularly preferred embodiment, a variable capacitor may be inserted in series or in parallel with the differential capacitor such that the resonant frequency may be precisely tuned to its desired value.

The present invention confers a technical advantage in that the difficult and time-consuming timing and matching process according to the prior art is replaced with a tuning and matching method that is fast and exact.

BRIEF DESCRIPTION OF THE DRAWINGS

Further aspects of the invention and their advantages will be discerned with reference to the appended drawings, in which like characters identify like parts wherever possible, and in which:

FIG. 1b is equations of input impedance and resonant frequency in terms of the values of the circuit components shown in FIG. 1a and each other;

FIG. 2b is equations for resonant frequency and input impedance in terms of the values of the components of the circuit shown in FIG. 2a and of each other;

DETAILED DESCRIPTION OF THE INVENTION

Figure 1A:
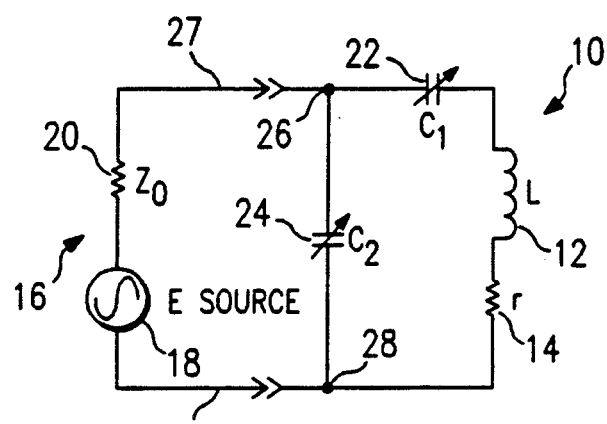
FIG. 1a is a first NMR probe coil tuning and matching circuit according to the prior art.

FIG. 1a is an electrical circuit diagram of a conventional impedance matching and tuning circuit. An NMR probe coil, indicated generally at 10, is modeled as an inductance 12 having a value of L and a resistance 14 having a value r in series with the inductance 12. A radio frequency energy source indicated generally at 16 is modeled as a generator 18 and an impedance 20 that has a value $Z_0$. The impedance 20 is in series with the generator 18. One conventional impedance matching and tuning circuit comprises a pair of variable capacitors 22 and 24. The variable capacitor at 22 has a value $C_1$, and the variable capacitor at 24 has a value $C_2$. One terminal of the capacitor 22 is connected to one end of the NMR probe coil 10 while another terminal thereof is connected to a node 26. Node 26 is in turn connected to one terminal of the RF energy source 16. A second variable capacitor 24 is connected between the node 26 and a node 28, which is turn is connected to another terminal 29 of the RF energy source 16 and the terminal of the NMR probe coil 10 opposite to that which capacitor 22 is connected.

The output impedance $Z_0$ of the RF energy source 16 must be matched by an input impedance of the NMR probe coil 10 in conjunction with the tuning and matching circuit comprised here of capacitors 22 and 24. The variable capacitances $C_1$ and $C_2$ must also be set to correctly tune the NMR probe coil to a desired resonant frequency $\omega$.

FIG. 1b sets forth an expression for $Z_0$ in terms of r, $C_1$, $C_2$, L and $\omega$, and further sets forth the algebraic expression for $\omega$ in terms of L, $C_1$, $C_2$ and r.

Figure 2A:
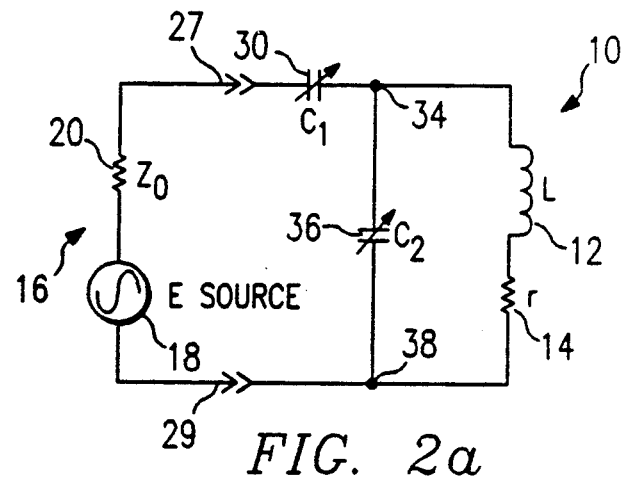
FIG. 2a is an electrical schematic circuit diagram of a second prior art tuning and matching circuit.

FIG. 2a is an electrical circuit diagram of another conventional NMR probe coil impedance tuning and matching circuit. In this circuit, a variable capacitor 30 has a value $C_1$ and is connected between the first terminal 27 of the RF energy source 16 and a node 34. A second variable capacitor 36 has a value $C_2$ and has terminals connected between the node 34 and a node 38. A second terminal 29 of the RF energy source 16 is connected to a node 38. The NMR probe coil 10 is connected across the nodes 34 and 38. Expressions for the input impedance at terminals 27 and 29 in FIG. 2a, and the resonant frequency of this circuit, are shown in FIG. 2b. The input impedance $Z_0$ is expressed in terms of L, $C_1$, $C_2$, the desired resonating frequency $\omega$ and the resistance r. $\omega$ is expressed in terms of the inductance L, the resistance r and the capacitances $C_1$ and $C_2$.

The expressions set forth in FIGS. 1b and 2b illustrate why the circuits shown in FIGS. 1a and 2a can be tuned and matched only in an iterative process. According to the iterative process conventionally used for tune and match circuits such as those shown in FIGS. 1a and 2a, the circuit is first tuned to the desired frequency $\omega$, then matched to the input impedance $Z_0$, then tuned back closer to the resonating frequency, etc. until the circuit is sufficiently tuned and matched within a desired margin of error. Sometimes, the frequency $\omega$ and impedance $Z_0$ can only be approximated and never matched.

Figure 3:
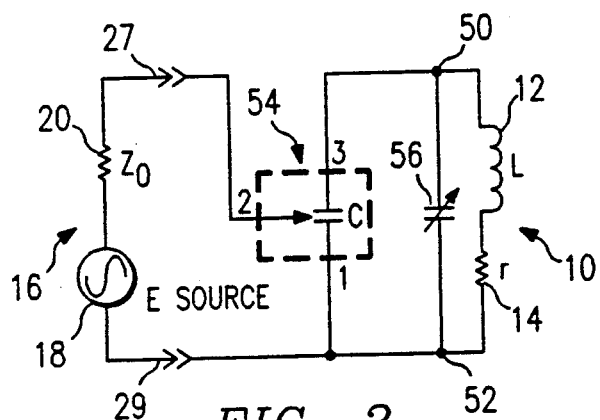
FIG. 3 is an electrical schematic circuit diagram of a first embodiment of a tuning and matching circuit according to the invention.

FIG. 3 is an electrical schematic diagram of a tuning and matching circuit according to the invention. In this circuit, the NMR probe coil, again modeled as an inductance 12 having a value L in series with a resistance 14 having a value r, has terminals 50 and 52. A differential capacitor, indicated generally at 54 by a dashed box, has a terminal 3 that is connected to the terminal or node 50, a terminal 1 that is connected to the terminal 52, and a terminal or tap 2 connected to the terminal 27 of the EMF source 16. The other terminal 29 of EMF source 16 is connected to terminal or node 52. In a preferred embodiment, a variable capacitor 56 is placed in the circuit across nodes 50 and 52 for a precise (but noniterative) adjustment of the desired resonating frequency.

The differential capacitor 54 has a total capacitance $C_{13}$ across its terminals 1 and 3, and larger capacitances $C_{12}$ and $C_{23}$ across terminal pairs 1,2 and 2,3, respectively. Ignoring for a moment the effect of variable capacitor 56, the input impedance of the circuit is:

$$Z_0 = P^2 \frac{L}{C_{13}r}, \text{ where } P = \frac{C_{13}}{C_{12}} \qquad (1)$$

Once again, ignoring for a moment the effects of the variable capacitor 56, the resonating frequency $\omega$ equals:

$$\omega = \frac{1}{\sqrt{LC_{13}}} \qquad (2)$$

As indicated above, in NMR applications, a variable capacitor is preferably used in parallel for tuning to the resonance frequency. These equations demonstrate that the resonance frequency will not change at all after it is initially set. This circuit may first be tuned to the desired resonant frequency $\omega$ and then matched by moving the tap 2 with respect to terminals 1 and 3, without changing the resonance frequency.

In considering capacitor 56, the variable P is recalculated as follows if capacitor if capacitor 56 has a capacitance value $C_{56}$:

$$P = \frac{C_{12} + C_{56}}{C_{12}C_{23} + C_{23}C_{56} + C_{12}C_{56}} \qquad (3)$$

and the resonance frequency is:

$$\omega = \frac{1}{\sqrt{LC}}, \; C = \frac{C_{12}C_{23}}{C_{12} + C_{23}} + C_{56} \qquad (4)$$

The above equations demonstrate that the user can tune the resonant frequency $\omega$ whenever the load on the NMR coil changes, and then match the circuit impedance $Z_0$ to get the maximum signal to noise ratio and power transfer.

Figure 4:
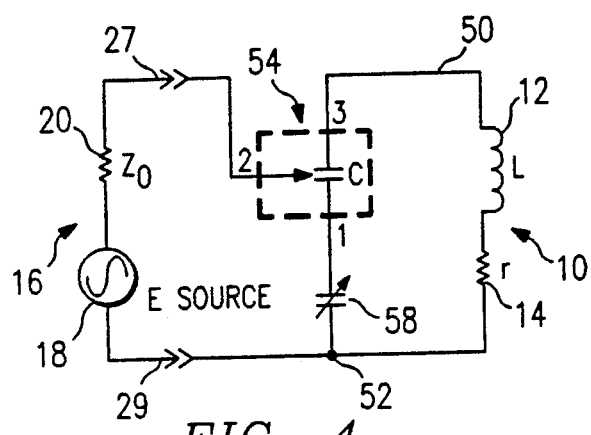
FIG. 4 is an electrical schematic circuit diagram of a tuning and matching circuit according to a second embodiment of the invention.

FIG. 4 is a schematic circuit diagram of an alternative embodiment of the invention. The circuit of FIG. 4 is like that of FIG. 3, except that the capacitor 56 has been removed from across the terminals 50 and 52, and a variable capacitor 58 has been placed in series between terminal 1 of the differential capacitor 54 and the node 52. The variable capacitor 58 has a capacitance value $C_{58}$.

The input impedance across terminals 27 and 29 of the circuit in FIG. 4 is still governed by equation (1) above, with only the calculation of P being different:

$$P = 1 - \frac{1}{1 + \frac{C_{23}}{C_{58}} + \frac{C_{23}}{C_{12}}} \quad (5)$$

As in the embodiment shown in FIG. 3, the tuning and matching of the circuit shown in FIG. 4 can be separated, such that the resonant frequency may be tuned whenever the load changes, and the circuit impedance may thereafter be matched to get the maximum signal to noise ratio and power transfer, without successive iterations.

While the tuning and matching method according to the invention is applicable to any NMR application, values for a typical imaging application are as follows. The radio frequency to be obtained generally falls within the range of 1 to 400 megahertz. The present invention is particularly advantageous for more high frequency application where the prior art tuning and matching problem is particularly difficult. For typical nuclear magnetic resonance imaging system, the energy to be input into the RF coil is on the order of one to ten kilowatts. The received energy is however typically less than a milliwatt. A typical input matching impedance has a scalar magnitude equivalent to 50 to 75 Ohms of resistance.

In practical NMR applications, the inductance L in any of FIGS. 1a, 3-7 is on the order of 0.1 microhenry to 10 microhenrys, while the resistance r of the inductive coil is in the range from $10^{-2}$ to $10^{-4}$ Ohms. The variable capacitance of capacitor 56 or capacitor 58 is chosen to vary between about 0.4 and about 200 picofarads.

The differential capacitor 54 as used in FIGS. 3 and 4 may take many forms. A unifying design criterion is that the capacitance $C_{13}$ should be the same, and should be independent of the placement of the tap 2. A so-called differential capacitor manufactured by Voltronics fails this test. The Voltronics capacitor is composed of opposed cylindrical capacitor plates that are slid axially inwardly and outwardly in relation to each other, thereby changing the capacitive area. For this reason, the Voltronics capacitor does not maintain a sufficiently constant capacitance $C_{13}$.

Figure 5:
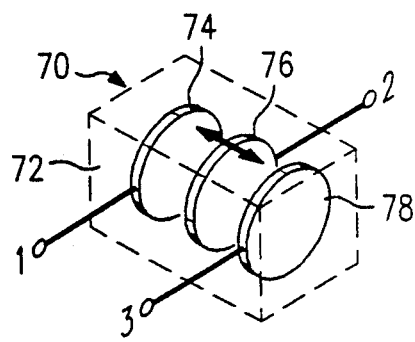
FIG. 5 is a simplified schematic isometric view of a first embodiment of a differential capacitor according to the invention.
Figure 7:
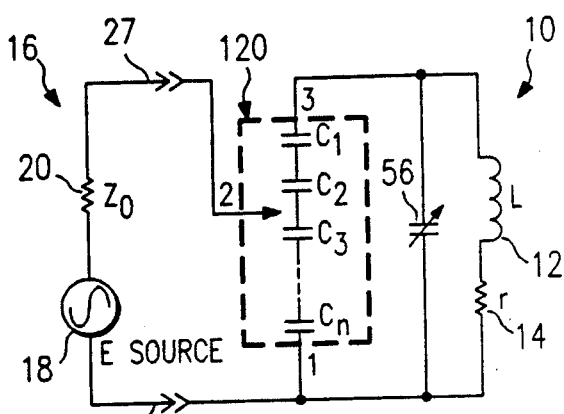
FIG. 7 is an electrical diagram of a tuning and matching circuit according to the invention showing a third embodiment of a differential capacitor.
Figure 6:
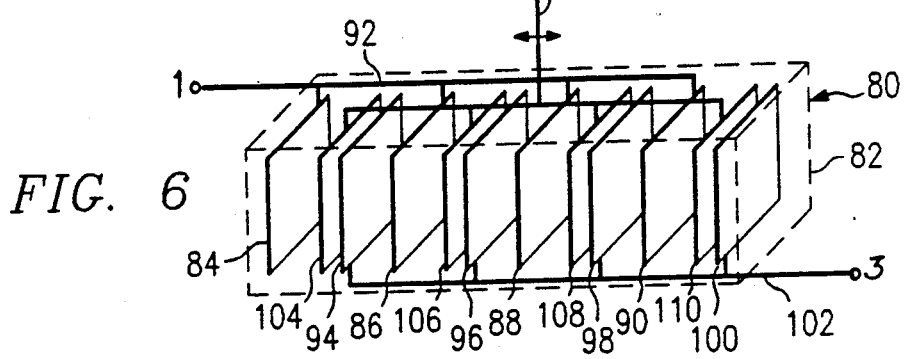
FIG. 6 is a simplified schematic isometric view of a differential capacitor according to a second embodiment of the invention.

Differential capacitor designs useful for implementing the invention are shown in FIGS. 5, 6 and 7. FIG. 5 is a 3-dimensional schematic isometric view of a differential capacitor indicated generally at 70 and having an enclosure 72 indicated by dotted lines. This simple differential capacitor 70 has a first plate 74, a tap plate 76 and a third pate 78 that are axially aligned in relation to each other and have the same shape. The precise shape of the capacitive plates 74, 76 and 78 is a matter of design choice, as is the shape of the enclosure 72.

The axial distance between the plate 74 and the plate 78 is fixed, thereby causing a constant capacitance $C_{13}$ to appear across the terminals 1 and 3 of the device 70. The capacitance $C_{13}$ may be chosen by varying the distance between the plate 74 and the plate 78, and the size of plates 74 and 78. Conductive connections are made from terminal 1 to plate 74, from plate 76 to tap 2, and from terminal 3 to plate 78, respectively.

A suitable mechanism (not shown) is provided to adjust the axial position of plate 76 in relation to plates 74 and 78. Plate 76 is held at right angles to the axis to which plates 74, 76 and 78 are aligned, and movement of the plate 76 is allowed only in the axial direction. As the plate 76 moves closer to plate 74, the capacitance $C_{12}$ will correspondingly increase, while the capacitance $C_{23}$ will decrease. On the other hand, as the plate 76 is moved closer to plate 78, $C_{23}$ will increase while $C_{12}$ will decrease, all while the resonating capacitance $C_{13}$ remains the same.

Plates 74, 76 and 78 can be made of any convenient conductive material on which charge will be evenly distributed. A suitable dielectric, such as air or vacuum, should separate plates 74, 76 and 78 and separate the same plates from the enclosure 72.

A second embodiment of the differential capacitor 70 is shown generally at 80 in FIG. 6. The differential capacitor 80 has a suitable enclosure 82 shown schematically in FIG. 6 by dotted lines. Within the enclosure are situated a plurality of first plates 84–90 which are arranged along a longitudinal axis and are parallel to each other. The plates 84–90 are insulated from the enclosure 82 and are fixed in position. At least one electrical lead 92 is connected to each plate and to terminal 1 to the exterior of the enclosure 82.

A plurality of second plates 94–100 are longitudinally disposed along the same axis and in parallel with each other. Each plate 94–100 is disposed a predetermined distance away from a respective opposed first plate 84–90. Each plate 94–100 is fixed in position, and is connected in parallel by an electrical lead 102 to terminal 3 outside of the enclosure 82. Plates 84–100 are constructed of suitable conductive materials so that a charge may be spread equally on their surfaces.

Plates 84, 94; 86, 96; 88, 98; and 90, 100 form four pairs of capacitor plates. The provision of only four pairs of plates is illustrative and may be extended further as desired. The interconnection of the plates in parallel across terminals 1 and 3 yields a capacitance $C_{13}$ which is equivalent to the sum of the capacitance between respective pairs of the plates 84–100.

A plurality of tap plates 104–110 are interposed between respective pairs of plates 84, 94; 86, 96; 88, 98; and 90, 100. Each of the tap plates 104–110 is constructed of a suitable conductive material to be of the same size and shape as the fixed plates with which they are aligned. While the tap plates 104–110 are rigidly positioned with respect to motion at right angles to the longitudinal axis of the differential capacitor 80, they are movable in unison along the longitudinal axis. The tap plates 104–110 are insulated from respective pairs of fixed plates 84–100 by a suitable dielectric, and are connected in parallel by an electrical lead 112 to an exterior terminal 2. The tap plates 104–110 are movable in either longitudinal axial direction, as indicated by the arrows. As the tap plates 104–110 are moved closer to the first fixed plates 84–90, the capacitance cross terminals 1 and 2 ($C_{12}$) will increase. As the tap plates 104–110 are moved closer to the second fixed plates 94–100, the capacitance $C_{12}$ will decrease. The total capacitance $C_{13}$ is, however, independent of the relative position of tap plates 104–110.

FIG. 7 is another embodiment of a tuning and matching circuit according to the invention. The circuit schematically illustrated in FIG. 7 is similar to that illustrate in FIG. 3, except for the form taken by the differential capacitor 120. In this embodiment, the differential capacitor 120 is fabricated of a plurality of capacitors $C_1$, $C_2$, $C_3$, ... $C_n$, where n is chosen as a convenient number with regard to the resonating frequency value desired in any one particular application. In this construction, a tap connected to the terminal 2 is moved between intercapacitive nodes in order to adjust the impedance-matching capacitance $C_{12}$. As can be seen, even while the impedance-matching capacitance $C_{12}$ is changeable, the resonant frequency $\omega$ capacitance $C_{13}$ remains the same. Further, the resonant frequency $\omega$ can be changed by varying the capacitance of capacitor 56 independently of the selection of the impedance matching capacitance $C_{12}$.

EXAMPLE

An experiment was performed to validate the theory using a circuit similar to that shown in FIG. 7. The variable capacitor 56 was not put in circuit, and n was chosen as 4. Each of the capacitors $C_1$–$C_4$ has a nominal value of 33 picofarads. The coil 10 that was used was 27 cm. in diameter and was a circular loop. A Hewlett-Packard network analyzer 8753B and 85046A S-parameter test set was used to monitor the tuning and matching. The circuit was tuned to a resonant frequency $\omega$ of 61 MHz. This resonance can be approached by tuning the imaginary part of the circuit to zero on the Smith Chart of the network analyzer. The divider position was then changed to get the desired input impedance $Z_0$.

Figure 8:
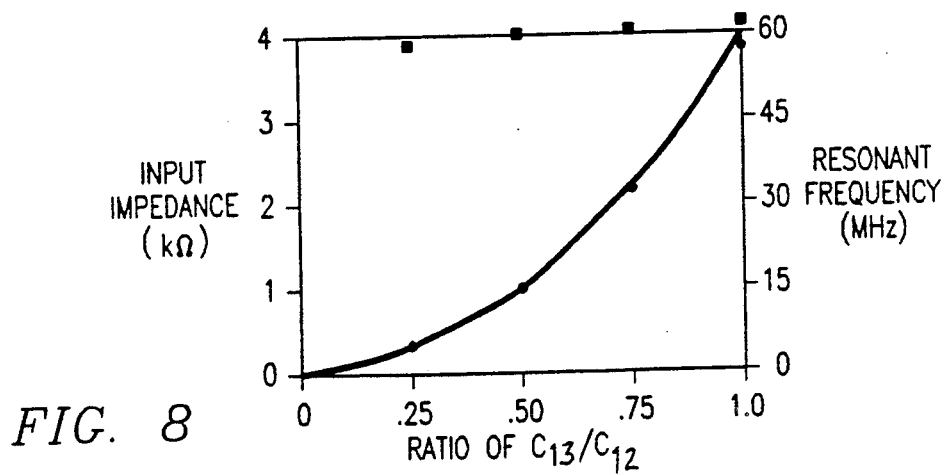
FIG. 8 is a graph of capacitance ratio to both input impedance and resonance frequency substantially corresponding to the circuit shown in FIG. 7.

Moving the divider or pointer position from between $C_3$ and $C_4$ to node 3 changes the impedance from 260 Ohms to 4200 Ohms, as is shown in the graph illustrated in FIG. 8. Actual input impedance values measured are shown by circular dots. However, the sixteen-fold change in the input impedance did not change the resonant frequency $\omega$ significantly. In FIG. 8, the resonant frequency $\omega$ is shown by square dots. Where the ratio of $C_{13}$ to $C_{12}$ was equal to 0.2, the resonant frequency w was measured as 60.3 megahertz. Where the ratio of $C_{13}$ to $C_{12}$ was 1.0, the resonant frequency $\omega$ changed to 62.3 megahertz. The use of the differential capacitor designs shown in FIGS. 5 or 6 would create the opportunity to continuously change the impedance of the resonance circuit. The change in measured resonant frequency is due to variances in the measured capacitances of $C_1$ through $C_4$, and from the different coil orientation which results when the divider position changes. A differential capacitor as illustrated in FIGS. 5 and 6 would yield improved experimental results.

In summary, a novel method and apparatus for tuning and matching an NMR probe coil have been disclosed, in particular by using a novel differential capacitor. While preferred embodiments of the present invention have been described in the above-detailed description, the invention is not limited thereto but only by the scope and spirit of the appended claims.

What is claimed is:

1. A differential capacitor, comprising:
first, second and third terminals;
means for varying a first capacitance across said first and second terminals, a second capacitance across said first and third terminals remaining substantially constant and independent of the value of said capacitance across said first and second terminals, a third capacitance defined across said second and third terminals;
said second capacitance being substantially equal to the inverse of the sum of (a) the inverse of said first capacitance and (b) the inverse of said third capacitance.

2. A differential capacitor, comprising:
first, second and third terminals;
a first conductive surface connected to said first terminal;
a second conductive surface connected to said third terminal and disposed at a fixed, predetermined distance from said first conductive surface; and
a tap conductive surface insulatively disposed between said first and second conductive surfaces and connected to said second terminal, said tap conductive surface operable to be moved toward or away from said first conductive surface to vary the capacitance between said first and second terminals.

3. The differential capacitor of claim 2, wherein said first, second and tap surfaces are plates disposed substantially in parallel to each other.

4. The differential capacitor of claim 2, wherein said conductive surfaces are substantially flat.

5. A differential capacitor, comprising:
first, second and third terminals;
a plurality of first conductive plates connected in parallel to said first terminal;
a plurality of second conductive plates disposed in parallel to respective ones of said first conductive plates, said second conductive plates connected in parallel to said third terminal, each second conductive plate being fixed in relation to a respective one of said first conductive plates; and
a plurality of tap conductive plates disposed in parallel between respective ones of said first and second conductive plates, said tap conductive plates insulated from said first and second conductive plates, said tap conductive plates connected in parallel to said second terminal, said tap conductive plates movable in unison toward or away from respective ones of said first conductive plates in order to vary the capacitance across said first and second terminals.

6. The differential capacitor of claim 5, wherein said conductive plates are substantially flat.

7. A differential capacitor, comprising:
first, second and third terminals;
a plurality of capacitors connected in series between said first and third terminals, each capacitor connected to an adjacent capacitor through an intercapacitor node; and
a tap for connecting to a selected one of said intercapacitor nodes or to a selected one of said first and third terminals, said tap connected to said second terminal, means for varying the connection of the tap to said selected one of said nodes or terminals in order to vary the capacitance across said first and second terminals.

8. A circuit for tuning a coil to a predetermined resonant frequency and for matching an input impedance of the circuit to an impedance of an EMF source, comprising:
a differential capacitor having first, second and third terminals, said first and third terminals connected to respective terminals of said coil, said first and second terminals connected to respective terminals of said EMF source; and
means for varying a capacitance across said first and second terminals, a capacitance across said first and third terminals remaining substantially constant and independent of the value of said capacitance across said first and second terminals, said capacitance across said first and third terminals preselected to obtain said desired resonant frequency, said capacitance across said first and second terminals adjusted to obtain a match to said impedance of said EMF source.

9. The circuit of claim 8, wherein said differential capacitor comprises:
   a first conductive surface connected to said first terminal;
   a second conductive surface connected to said third terminal and disposed at a fixed, predetermined distance from said first conductive surface; and
   a tap conductive surface insulatively disposed between said first and second conductive surfaces and connected to said second terminal, said tap conductive surface operable to be moved toward or away from said first conductive surface to vary the capacitance between said first and second terminals.

10. Apparatus for tuning a nuclear magnetic resonance (NMR) probe coil to a desired resonant frequency and for matching a combined input impedance of said coil and said apparatus to the output impedance of an EMF source, comprising:
    a differential capacitor having first, second and third terminals, terminals of said NMR coil connected to said first and third terminals of said differential capacitor, respective terminals of said EMF source connected to said second and third terminals of said differential capacitor; and
    means for varying a capacitance across said first and second terminals in order to achieve a match of said input impedance to said output impedance, a capacitance across said first and third terminals preselected to obtain said resonant frequency, said capacitance across said first and third terminals remaining substantially constant and independent of the value of said capacitance across said first and second terminals.

11. The apparatus of claim 10, and further comprising:
    a first conductive plate connected to said first terminal;
    a second conductive plate connected to said third terminal and disposed in fixed relationship to said first conductive plate; and
    a tap conductive plate insulatively disposed between said first and second conductive plates and connected to said second terminal, said tap conductive plate disposed in parallel with said first and second conductive plates, and operable to be moved toward or away from said first conductive plate to vary the capacitance between said first and second terminals.

12. The apparatus of claim 10, add further comprising:
    a plurality of first conductive plates connected in parallel to said first terminal;
    a plurality of second conductive plates disposed in parallel to respective ones of said first conductive plates, said second conductive plates connected in parallel to said third terminal, each second conductive plate being fixed in relation to a respective one of said first conductive plates; and
    a plurality of tap conductive plates disposed in parallel between respective ones of said first and second conductive plates, said tap conductive plates insulated from said first and second conductive plates and connected in parallel to said second terminal, said tap conductive plates movable in unison toward or away from respective ones of said first conductive plate in order to vary the capacitance across said first and second terminals.

13. The apparatus of claim 10, and further comprising:
    a plurality of capacitors connected in series between said first and third terminals, each capacitor connected to an adjacent capacitor through an inter-capacitor node; and
    a tap for connecting to a selected one of said inter-capacitor nodes or to a selected one of said first and third terminals, said tap connected to said second terminal, means for varying the connection of the tap to said selected one of said nodes or terminals in order to vary the capacitance across the said first and second terminals.

14. The apparatus of claim 10, and further comprising a variable capacitor connected across said first and third terminals for tuning said apparatus and said coil to said desired resonant frequency.

15. The apparatus of claim 10, and further comprising a variable capacitor, a first terminal of said variable capacitor connected to said first terminal of said differential capacitor, a second terminal of said variable capacitor connected to a terminal of said NMR probe coil, said variable capacitor operable to have its capacitance varied for tuning said apparatus and said NMR probe coil to said desired resonant frequency.

16. A method for tuning a nuclear magnetic resonance probe coil to a desired resonant frequency and for matching the probe coil to an impedance of an EMF source, comprising the steps of:
    selecting a differential capacitor having a constant capacitance across first and third terminals thereof that, when placed across the probe coil, will cause the coil to resonate at the desired resonant frequency;
    coupling the first and third terminals of the differential capacitor across terminals of the probe coil;
    adjusting a tap of the differential capacitor to set an input impedance of the probe coil and capacitor to substantially equal the EMF source impedance; and
    connecting the EMF source between the tap and a preselected one of the probe coil terminals.

17. The method of claim 16, and further comprising the steps of:
    connecting a variable capacitor across the terminals of the probe coil; and
    adjusting the capacitance of the variable capacitor in order to precisely tune to the resonant frequency.

18. The method of claim 16, and further comprising the steps of:
    connecting a first terminal of a variable capacitor to the first terminal of the differential capacitor;
    connecting a second, opposed terminal of the variable capacitor to a terminal of the probe coil; and
    varying the capacitance of the variable capacitor in order to precisely tune to the desired resonant frequency.

19. The method of claim 16, wherein said step of adjusting comprises moving a tap conductive plate insulatively disposed between a first conductive plate connected to the first terminal and a second conductive plate connected to the third terminal toward or away from the first conductive plate in order to vary the capacitance across the first and second terminals.

20. A differential capacitor, comprising:

a plurality of capacitive elements substantially solely providing all capacitances of said differential capacitor, said elements consisting of first, second and third integral conductors; and means for varying a capacitance between said first and second conductors, a capacitance between said first and third conductors remaining substantially constant and independent of said capacitance between said first and second conductors.

21. The differential capacitor of claim 20, wherein said conductors are plates.

22. The differential capacitor of claim 21, wherein said conductors are substantially flat.

23. A differential capacitor, comprising:

a plurality of sets of capacitive elements substantially solely providing all capacitances of said differential capacitor, said sets consisting of first, second and third sets of integral conductors, each integral conductor within a set disposed in fixed relationship with each other integral conductor within the last said set;

means for varying a capacitance between said first and second sets of conductors, a capacitance between said first and third sets of conductors remaining substantially constant and independent of said capacitance of said first and second sets of conductors.

24. The differential capacitor of claim 23, wherein said conductors are plates.

25. The differential capacitor of claim 24, wherein said conductors are substantially flat.

* * * * *